United States Patent [19]

Pastor et al.

[11] Patent Number: 4,724,038

[45] Date of Patent: Feb. 9, 1988

[54] PROCESS FOR PREPARING SINGLE CRYSTAL BINARY METAL OXIDES OF IMPROVED PURITY

[75] Inventors: Ricardo C. Pastor, Manhattan Beach; Luisa E. Gorre, Oxnard, both of Calif.

[73] Assignee: Hughes Aircraft Company, Los Angeles, Calif.

[21] Appl. No.: 870,202

[22] Filed: Jun. 2, 1986

[51] Int. Cl.$^4$ .............................................. B01J 17/18
[52] U.S. Cl. ..................... 156/620.2; 156/DIG. 71; 156/DIG. 75; 156/DIG. 78; 156/DIG. 87; 156/DIG. 89; 156/617.1; 423/593; 423/598
[58] Field of Search ..... 156/617 R, 617 SP, DIG. 75, 156/DIG. 78, DIG. 89, DIG. 71, 87; 423/593, 598

[56] References Cited

U.S. PATENT DOCUMENTS

| | | | |
|---|---|---|---|
| 2,696,651 | 12/1954 | Gravley | 423/598 |
| 4,144,117 | 3/1979 | Fukuda et al. | 156/617 SP |
| 4,439,265 | 3/1984 | Alferness et al. | 156/DIG. 89 |
| 4,609,694 | 9/1986 | Morimoto et al. | 423/598 |

FOREIGN PATENT DOCUMENTS

| | | | |
|---|---|---|---|
| 7214335 | 5/1968 | Japan | 423/598 |
| 7335160 | 8/1970 | Japan | 423/598 |
| 5042238 | 3/1980 | Japan | 156/DIG. 78 |
| 5056097 | 4/1980 | Japan | 423/593 |
| 8095690 | 6/1983 | Japan | 423/593 |

OTHER PUBLICATIONS

Belrus et al., Mat. Res. Bull., vol. 6, pp. 899–906 (1971).

Primary Examiner—Asok Pal
Attorney, Agent, or Firm—Wanda K. Denson-Low; A. W. Karambelas

[57] ABSTRACT

A method is disclosed for the growth of single crystals of a binary metal oxides of the formula $ABO_3$ where A is an alkali or alkaline earth metal, B is at least one element selected from titanium, niobium and tantalum. A mixture comprising the constituent components of the $ABO_3$ crystal is prepared using a basic oxide or carbonate of A and a stoichiometric excess of an acidic oxide of B. The mixture is heated at an elevated temperature to form a melt and is thereafter exposed to a reactive atmosphere of a mixture of gaseous carbon monoxide and carbon dioxide. Crystal growth from the melt is effected by a top-seeded crystal pulling technique.

8 Claims, 7 Drawing Figures

PROCESS FOR PREPARING SINGLE CRYSTAL BINARY METAL OXIDES OF IMPROVED PURITY

BACKGROUND OF THE INVENTION

1. Field of the Invention

This invention is concerned with a method for preparing single crystal binary metal oxides having the formula $ABO_3$, wherein A is an alkali or alkaline earth metal and B is either Ti, Nb, Ta or mixtures thereof. More particularly, the instant invention relates to the preparation of single crystal binary metal oxides with are grown noncongruently and isothermally in the presence of a reactive atmosphere.

2. Description of Related Art

It has been known that certain combinations of binary metal oxides have significantly useful ferroelectric properties. Ferroelectric properties occur when crystalline materials exhibit a permanent, spontaneous, electric polarization by means of an electric field. One such compound, barium titanate, is unique in that it is a perovskite-type compound, in that it exists in several forms, ie., tetragonal, hexagonal, cubic, etc. depending upon temperature. These crystalline modifications are important since they enable compounds such as barium titanate to also exhibit piezoelectric properties.

Piezoelectricity is the phenomenon whereby crystalline substances generate electrical charges when subjected to mechanical deformation. This property leads to applications in transducers, ultrasonic equipment, etc. The high dielectric constant and temperature coefficient of materials such as barium titanate, also lead to their use in the construction of small capacitors in temperature sensitive devices.

Compounds such as barium titanate also exhibit photorefractive properties which suggest a high potential for use in optical computing and image processing. There are a large number of other applications for which compounds such as $BaTiO_3$ would be useful. These uses include bulk and surface wave acoustic devices, bulk modulator, modulators and switches for thin-film integrated optical circuits, sensitive thermal detectors and frequency doublers in the visible and microwave spectral regions. However, while compounds such as barium titanate are very promising for a wide variety of applications, the commercial availability of these compounds is limited. Moreover, the supply which is available is relatively impure.

High optical quality, single crystal electro-optic materials with controlled impurity background and dopant content are critical to optical data and other non-linear applications of importance to integrated circuits. Binary metal oxides of the titanate, niobate, and tantalate class, although exhibiting electro-optic properties, have not found use in the aforementioned electro-optical applications as it is difficult to grow crystals of these oxides of the requisite purity and size, e.g., greater than one centimeter in diameter.

V. Belruss, et al discuss another method of growing oxides in an article entitled "Top-Seeded Solution Growth of Oxide Crystals from Non-Stoichiometric Melts", Mat. Res. Bull., Vol. 6, pp. 899–906 (1971). More specifically, Belruss, et al claim that this technique would allow "one to avoid crystallization of the hexagonal phase of $BaTiO_3$ without adding strontium or calcium, and avoiding the thermal strains inherent in crystals grown by the Czochralski or float zone techniques". However, when crystals are noncongruently grown as shown above, crystal size is limited by diffusion dynamics. More specifically, at the growth interface, the composition is mismatched and the solvent acts as a diffusion barrier. Thus, mass transport for constant crystal composition is diffusion limited, and the growth of large crystals therefore requires long time periods. During those periods, the risk of occluding the solvent in the growing solid exists, and thus the probability of maintaining uniform quality in a moderately sized crystal, ie., approximately 1 cm on an edge, is low. The solvent also serves as a mass transport medium for cation and anion impurities.

D. E. Rase et al, however, disclose in "Phase Equilibria in the System $BaO$-$TiO_2$", J. Am. Ceram. Soc., 38, 102 (1955), that it would be possible with proper seeding and temperature control, to grow single crystals of $BaTiO_3$ under equilibrium crystallization conditions from a mixture containing an excess of $TiO_2$ (e.g., 55 mole %) by slowly cooling it from about 1600° to 1300° C. Rase, et al concluded that while such a method would have the advantage of lower temperature, thus avoiding contamination, it would also have a significant disadvantage. By allowing growth via the above method, such growth would be in a two-phase region over a range of temperatures rather than at a single temperature. The two phases consist of the solid (with the desired structure) and the melt. The composition of the two phases are unequal, hence noncongruence. The composition mismatch continues to increase curing the growth of the crystal which slows the growth rate.

The main drawback of conventional growth methods stems from the nonrigid exclusion of $H_2O$ in the vapor phase and $OH^-(c)$ in the condensed phase. $BaTiO_3$ crystals are conventionally noncongruently grown from a mixture of $BaO$ and $TiO_2$ wherein excess $TiO_2$ is used as the flux. Growth proceeds by slow cooling of the melt from a temperature of 1390° C. in the presence of air or oxygen. Water vapor which is present in the atmosphere surrounding the melt from which the crystal is grown, as well as in the outgas of the apparatus in which crystal growth is conducted, invariably leads to contamination of the $BaTiO_3$ crystal by hydroxyl ion ($OH^-$) impurity, even at the elevated temperatures employed for crystal growth. Water vapor adds on readily to the oxide ($O^{--}$) melts to form the hydroxide ($OH^-$) impurity as illustrated in the following equation:

$$O^{--}(c) + H_2O \rightarrow 2OH^-(c), \tag{1}$$

where (c) refers to the condensed phase of the oxide, which at the temperatures (1300°–1400° C.) employed for the solid-state growth of the crystal, is the melt phase. In the heated crystal, the reverse reaction is active and provides a mechanism for the formation of an anion vacancy, :

$$2OH^-(c) \rightarrow O^{--}(c) + \boxed{O} + H_2O. \tag{2}$$

The progressive increase in the vacancy density leads to the production of color centers, 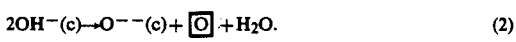, and is responsible also for an abnormal oxygen-dissociation pressure:

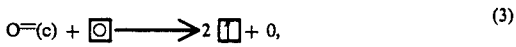

$$O^=(c) + \boxed{O} \longrightarrow 2\,\boxed{\phantom{x}} + 0, \tag{3}$$

$$2O \longrightarrow O_2$$

-continued $$2\,\boxed{T} \longrightarrow \boxed{\mathrm{II}} + \boxed{O}.$$

The use of hydrogen ($H_2$) in the reduction of oxides accomplishes a similar degradation as follows:

$$O^{--}(c) + \boxed{O} + \tfrac{1}{2}H_2 \rightarrow OH^-(c) + \boxed{T}. \tag{4}$$

Note that although $H_2$ is not provided in Eqs. (1) to (3) the same reducing agent, $\boxed{T}$, the solvated electron, is produced as in Eq. (4).

Water vapor in the air and from the outgas of the apparatus enhances the corrosive action of the oxide ($BaTiO_3$) melt on the crucible (platinum). This mandates an operating temperature below 1400° C.

The prior art procedure for growing single crystal binary metal oxides, employed oxygen or air to combat the tendency of the oxide melt to dissociate thereby producing a crystal which is oxide deficient. The water vapor present in the atmosphere and outgas of the apparatus used for the growing of the crystals also raises the corrosive action of the binary metal oxide whereby it reacts with the platinum walls of the crucible. This reaction results in the formation of hexagonal, solid $Ba_3Pt_2O_7$ and limits the reaction temperature to that of below 1400° C. A temperature below 1400° C. is below the melting point of $BaTiO_3$. At a temperature below 1400° C., one can realize only congruent growth.

A method of eliminating water vapor from the environment in which binary metal oxide crystals are grown and of removing the presence of any $OH^-$ impurities formed thereby, is therefore needed.

SUMMARY OF THE INVENTION

In accordance with the present invention, single crystal binary metal oxides of the formula $ABO_3$, wherein A is an alkali or alkaline earth metal and B is a metal selected from titanium, niobium, tantalum and mixtures thereof, are prepared having improved purity and size.

More specifically, the present invention relates to a method for the growth of a single crystal binary metal oxide of the formula $ABO_3$ wherein A is an alkali or alkaline earth metal, B is at least one element selected from the group consisting of titanium, niobium and tantalum by (a) preparing a mixture of a basic oxide or carbonate of A and an amount of an acidic oxide of B which is in excess of the stoichiometric amount required to form the $ABO_3$ crystal;

(b) heating the mixture to an elevated temperature of from 700° C. to 900° C. to prepare a melt;

(c) exposing the melt to a reactive atmosphere of a mixture of carbon monoxide and carbon dioxide for a period of time sufficient to effect single crystal growth of substantially pure, $ABO_3$ crystal.

DESCRIPTION OF THE PREFERRED EMBODIMENTS

Figure 1:
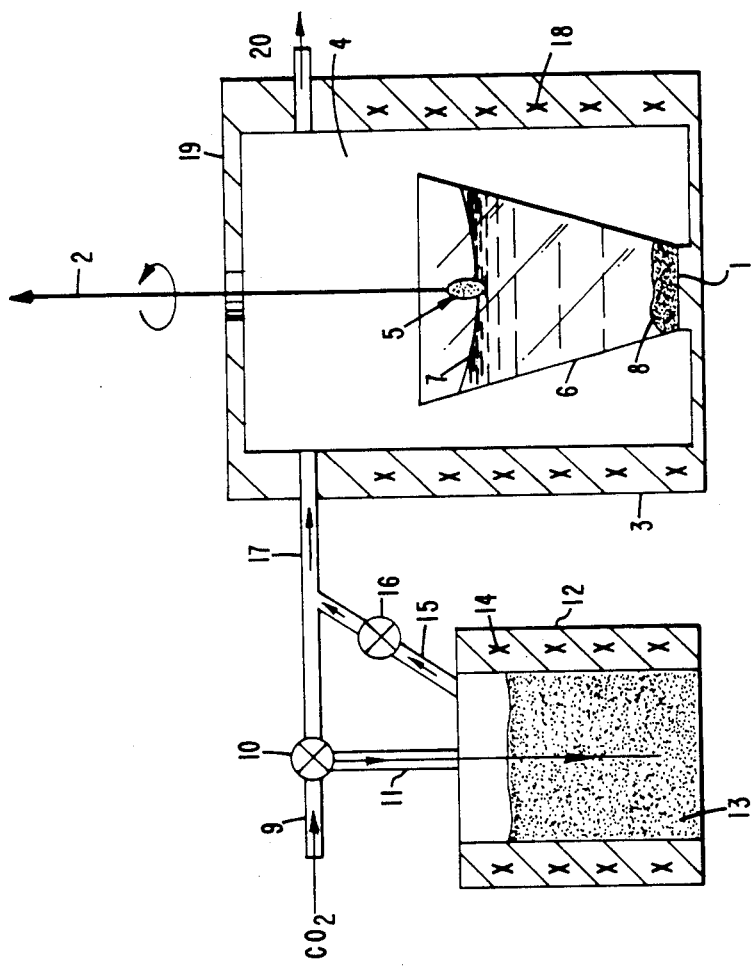
FIG. 1 is a schematic diagram of an apparatus for preparing single crystal of $ABO_3$ compositions.

The present invention relates to a method for the growth of single crystal binary metal oxides of the formula $ABO_3$, wherein A is an alkali or alkaline earth metal and B is at least one element selected from the group consisting of titanium, niobium and tantalum which method comprises preparing a mixture of a basic oxide or carbonate of A and an amount of an acidic oxide of B which is in excess of the stoichiometric amount required to form the $ABO_3$ crystal. The mixture is heated to an elevated temperature in order to prepare a melt which is thereafter exposed to a reactive atmosphere comprised of a mixture of gaseous carbon monoxide and carbon dioxide for a period of time sufficient to effect single crystal growth of a substantially pure (greater than 99.99% purity) $ABO_3$ crystal.

The process of the instant invention does not use air or oxygen, the main sources of crystal impurity which can corrode the apparatus. Rather, the $CO_2$ component of the reactive gas mixture of the instant invention, because of its higher oxygen-dissociation pressure ie., higher than that of $BaO$ or $TiO_2$, exerts a sufficiently oxidizing effect upon the crystal components so as to eliminate the need for air or oxygen. This same relationship holds true for the components of $Nb_2O_5$ of the niobate and $Ta_2O_5$ of the tantalate.

Further, the use of $CO_2$ as part of the reactive atmosphere mixture results in a smaller $OH^-(c)$ concentration in the melt in accordance with the following equations:

$$CO_2 + OH^-(c) \rightleftharpoons HCO_3^-(c) \tag{I}$$

$$HCO_3^-(c) + OH^- \rightleftharpoons CO_3^=(c) + H_2O$$

---

$$CO_2 + 2OH^-(c) \rightleftharpoons CO_3^=(c) + H_2O$$

The tradeoff in the reduction of the $OH^-(c)$ impurity, however results in a carbonate impurity, $CO_3^{--}(c)$. The carbonate impurity however, is planar and much smaller in size while the larger titanate favors an octahedral coordination of oxide ions. Moreover, this carbonate impurity, $CO_3^{--}(c)$ is substantially destroyed by the excess oxide of $TiO_2(c)$, the flux material in accordance with the equation:

$$CO_3^{--}(c) + TiO_2(c) \rightarrow TiO_3^{--}(c) + CO_2 \uparrow \qquad (II)$$

Thus, any $CO_3^{--}$ impurity not destroyed by reaction with excess $BO_2$ or $B_2O_5$ will have a minimal effect on the crystalline structure of the $ABO_3$ crystal, since $CO_3^{--}$ is of a relatively small size and planar in structure.

While the $CO_2$ component of the reactive gas mixture scavenges $OH^-$ from the melt, the CO component of the gas mixture getters out water from the vapor in accordance with the equation:

$$CO + H_2O \rightarrow CO_2 + H_2 \qquad (III)$$

Carbon monoxide is also capable of scavenging $OH^-$ from the melt in accordance with the equation:

$$CO + 2OH^- \rightarrow O^{--}(c) + CO_2 + H_2 \qquad (IV)$$

The single crystal $ABO_3$ materials of the present invention are noncongruently grown from a starting powder obtained by mixing, e.g. by ball milling, about 35 to about 45 mole percent of a pure (reagent grade) powdered basic oxide or carbonate of A and a stoichiometric excess, approximately 55 to about 65 mole percent of a pure (reagent grade) powdered acidic oxide of a B metal selected from the group consisting titanium, niobium, tantalum and mixtures thereof. Suitable basic oxides or carbonates of A can include BaO, $Li_2O$, $Na_2O$, $BaCO_3$, $Li_2CO_3$, $Na_2CO_3$, $Ba(NO_3)_2$, $LiNO_3$, $NaNO_3$, etc. Suitable B-metal oxides can include $TiO_2$, $Nb_2O_3$ and $Ta_2O_5$.

The Group I and II metals of the periodic table form basic oxides since when they are introduced into water, they produce a basic reaction as evidenced by the following:

$$B_2O + H_2O \rightarrow 2BOH \quad (B = \text{Group I})$$

$$BO + H_2O \rightarrow B(OH)_2 \quad (B = \text{Group II})$$

An acidic oxide, for example $A_2O_5$, would give an acidic reaction in water, as per the following:

$$A_2O_5 + 2H_2O \rightarrow 2HAO_3$$

The "H" constituent in these oxide compounds do not bond directly to the metal (M), which can be either A or B, but rather, through the oxide, i.e., M—O—H. If the electronic structure is such that the weakest link is between M and O, i.e., M—O—H then it will give rise to an $OH^-$ species and the oxide of "M" will be basic. However, if the weakest link is between O and H, i.e., M—O—H, then it will generate an $H^+$ species and the oxide of "M" will be acidic.

FIG. 1 is an illustration of an apparatus which can be utilized to prepare the single crystal binary metal oxides of the present invention. Referring to FIG. 1, an apparatus is illustrated therein for preparing $ABO_3$ crystals of high purity (greater than 99.99% purity). Carbon dioxide is provided from a source (not shown) and is introduced, through an inlet tube (9) made of pyrex or other inert material, into a flow meter (10), where the flow of the carbon dioxide is adjusted to a desired value, such as 1 to 2 cc/sec. The carbon dioxide passes from the flow meter (10) through a tube (11), made of pyrex or other heat resistant material into a fused silica gas generator chamber (12), which is packed with a bed of high purity (99.99% pure) carbon particles (13). The chamber (12) is heated, e.g., to about 700°-900° C. to reduce the carbon dioxide to carbon monoxide in accordance with the equation:

$$CO_2 + C \rightleftharpoons 2CO$$

Before that reaction is conducted, the heated graphite is purged with the $N_2$ or He so as to remove absorbed gases, especially water vapor.

The heating of the chamber (12) is accomplished by means of a resistance heating chamber (14) which surrounds the chamber (12). The resistance heating element (14) may be made of Nichrome and is activated by applying a controlled voltage thereto. A thermocouple (not shown) is inserted between the outside wall of the chamber (12) and the heating element (14) in order to monitor the temperature of the chamber (12). As indicated in the equation immediately above, carbon monoxide gas is produced when a portion of the $CO_2$ gas which flows into the chamber (12) passes through the heated carbon particle bed (13) so that a $CO/CO_2$ mixture exits the chamber (12) through pipe (15). At 900° C. and a gas flow of 1 to 2 cc/sec, gas chromatography indicates that the effluent has a molar ratio of $CO:CO_2 = 7:1$. However, much lower ratios, $CO:CO_2 = 1:9$ have been shown to work. Therefore, lower operating temperatures of 700°-900° C. are preferred. A valve (16) controls the flow of the $CO/CO_2$ mixture into the headspace (4) through an alumina or vitreous silica inlet pipe (17). The crucible (1) is formed from a platinum (20%) rhodium (40%) alloy. The crucible (1) is preferably composed of platinum-rhodium which assists in preventing contamination of the melt since platinum is fairly nonreactive. Utilizing a platinum-rhodium combination also affords higher operating temperatures than would otherwise be afforded utilizing platinum alone. The furnace is structured so as to create a condition where the bottom of the crucible (1) can be maintained at a higher temperature than the top of the crucible (1). This creates a thermal gradient which aids in transporting the nutrient from the bottom of the crucible to the crystal-melt interface to allow isothermal growth of the crystals. "Cool down" is a stage of the operation that occurs after isothermal growth, i.e., when the crystal is lifted off the melt. The cool-down rate aids in minimizing thermal stress on the crystal until a temperature is reached at which the crystal is able to withstand the shock of the ambient environment, i.e., structurally sound. The crucible (1) is contained within an electric furnace (3) provided with heating element (18) which is used to heat the crucible (1) to a predetermined isothermal temperature whereby two phases are created in the crucible, namely a solid $ABO_3$ crystal phase (8) at the bottom of the crucible (1) and a melt phase (6) above the solid residue phase (8).

The headspace (4) is sealed with a cover (19) which is fitted over the furnace opening. The cover (19) is drilled to admit pull rod (2) which is mounted therein for sliding, vertical, rotatable operation in and out of the crucible melt phase (6). The rod (2) is formed of a platinum-rhodium alloy and is hollow to admit the entrance of air or other cooling gas. A seed crystal (5) of $ABO_3$ is cemented or otherwise attached to the bottom of the pull rod (2). The opposite end of the rod (2) is attached to a motor or other means (not shown) whereby the pull rod (2) may be raised or lowered into the crucible melt (6). Growth occurs on the seed crystal (5) as it is rotated and slowly pulled from the molten liquid surface (7).

The headspace (4) is also provided with alumina or vitreous silica tubing (20) through which excess gas reactants are exhausted from the headspace (4) and are passed to a scrubber (not shown) so that any environmentally undesirable gaseous products are removed before the exhaust gas is released to the surrounding atmosphere.

In operation, gaseous high purity carbon dioxide is arranged to be metered by flow meter (10) at the rate of about 1-2 cc/sec. into the reactive gas generator (12) through tube (11). The bed (13) of carbon particles in the generator (12) is heated to about 700° C. to about 900° C. so that a portion of the $CO_2$ passed through the carbon particle bed is reduced to CO whereby the gaseous CO mixture exiting the generator (12) contains about 10% to about 90% CO in carbon dioxide at a molar ratio of about 1:9 to about 7:1 and preferably 1:7 to about 2:7.

A powdered charge consisting of a mixture of a basic oxide or carbonate of A and an acidic metal oxide of B, to be formed into the single crystal $ABO_3$, is placed in the Pt-Rh crucible (1) in amounts such that there is a 10-20 mole % excess of the metal oxide of B. The crucible (1) filled with the powder charge is positioned in the electric furnace. The furnace temperature is so adjusted that the crucible temperature is elevated to a temperature at which the growth of the single crystal binary metal oxide occurs isothermally, generally at a temperature range of about 500° C. to about 1800° C. at which temperature range the $CO/CO_2$ gaseous mixture will attack the $OH^-$ impurities present in the binary metal oxide melt as well as react with any outgas water vapor. Generally, the operating temperature is determined by the amount of the oxide of B that is in excess of the stoichiometric value. It is also determined by the nature of the cations of A and B. Operating temperatures will vary depending on the binary metal oxide even if the stoichiometric amount of B-oxide is the same, for example, 1400° C. is typical for $BaTiO_3$ while 1100° C. is typical for $KNbO_3$.

After the powdered charge in the crucible (1) has reached the isothermal crystal growth temperature and is in the molten state, the pull rod (2) is lowered into the crucible (1) and the seed crystal (5) attached to the rod (2) is brought into axial, rotational contact with the surface (7) of the molten liquid (6) to begin the growth cycle. The rotational rate of the rod (2) can be varied from 10 rpm to 400 rpm. Air or other cooling gas is circulated through the hollow rod to establish a temperature gradient between the growing crystal (5) and the molten liquid surface (7). The temperature of the crystal (5) is lowered by the cooling gas along the liquidus line at rates in the order of a few tenths of a degree per hour. This cooling feature is necessary to initiate crystal growth. However, the cooled portion (crystal) must steadily be withdrawn in a manner such that where the crystal interfaces the melt, one has essentially an isothermal situation. At the same time, the rod (2) is raised and the crystal (5) is slowly withdrawn from the melt at rates on the order of 0.5 to 1 millimeter per hour, whereby single crystals of $ABO_3$ in the order of 1 cm. diameter or more are obtained. As the seed crystal (5) is moved upwardly, a skirt of molten liquid is lifted up and cooled. Cooling takes place primarily along the axis by conduction loss of the cooled rod and subordinately by radiative losses from crystallizing onto the seed tip. Axial cooling (conduction along the rod) must be the primary cooling mode in this configuration of crystal growth. If peripheral cooling (radiation to the colder surrounding) were to assume a commanding position, the crystal diameter would be out of control. It would touch the crucible and freeze up the surface layer. This new solid material, in turn, interfaces with the melt constantly as the seed is pulled slowly upwardly from the melt surface and more crystal is added. The crystal growth rate matches the pulling rate and large size crystals, i.e., greater than 1 centimeter (cm.) in diameter, are thereby formed.

It is advantageous in the practice of the present invention to heat the crystal components to the molten state utilizing the temperature at which $ABO_3$ crystals are isothermally grown. The isothermal temperature of crystal growth is determined as follows:

The working isotherm for a given starting concentration of A-metal oxides or carbonates and B-metal oxides corresponds to a position in the tie-line where about 20% of the molten mixture consists of a solid residue of a cubic $ABO_3$ crystal in the melt. The tie-line is determined by the horizontal line whose vertical position was determined by the working temperature (isothermal growth). The line spans a two-phase region, the crystal and the melt, and its extremities touch the boundary where the two-phase region becomes a single phase, the crystal at one end and the melt at the other. The projection of the tie line to the horizontal scale defines the composition range. Hence, choosing the composition and the working temperature determines that point within the tie-line which, in turn, would determine the fraction of the two-phase region that is the solid (crystal). This polycrystalline solid settles as a sediment at the bottom of the melt.

The choice of the working temperature is often set by the thermal capability of the crucible or the melting incongruency of the material. The choice of composition determines the position in the tie-line and therefore, the residue content. The latter determines the extent of vertical clearance between the top of the sediment and the interface of the growing crystal above. Those two surfaces should not be too close. Note that the solid above the interface is a single crystal and that below are polycrystalline. The bottom of the crucible is maintained isothermally but slightly above the isothermal plane of the growth regions. In this manner, some of the residue located at the bottom of the crucible dissolves in the melt and is transported as nutrient to deposit on the single crystal. This occurs because the growth region is slightly colder. If the objective is to grow a crystal which is equivalent to a cube that is ~1 cm to the edge, then we are projecting a total transport of 10 g material from the bottom (residue). If our total crucible charge is 100 g, then a 20% residue content would guarantee that there will always be a source of nutrient content at the bottom. However, as the residue content is increased the vertical clearance is decreased and the probability of maintaining good single-crystal growth from beginning to the end of the operation is decreased.

For example, in the preparation of cubic $BaTiO_3$, when the powder charge contains 62 mole percent $TiO_2$, the liquidus temperature is 1525° C. This is determined by consulting the latest version of the phase diagram which is available. The corresponding operating temperature for isothermal growth is determined to be 1450° C. As discussed previously, the growth region which is just below the gas-melt interface, must have a colder isothermal temperature than that existing at the crucible bottom. The liquidus temperature sets an upper limit temperature as compared with the temperature at the crucible bottom. Usually, one tries to achieve a 25°-50° C. difference between the two isothermal planes. If the isothermal at the crucible bottom were to exceed the liquidus temperature, the sediment at the bottom would completely dissolve. The existence of the sediment is essential to achieving a stabilizing effect on the composition of the melt. The intervening melt serves as a vehicle for material transport from the polycrystalline sediment to the single crystal above.

Upon completion of the crystal growth, the pull rod (2) is raised out of the melt to extract the crystals formed thereon.

The following examples is set forth to illustrate the present invention. These examples should not be deemed as limiting the scope thereof.

EXAMPLE I

One would start with a 100 g starting charge. Then utilizing apparatus schematically shown in FIG. 1, one would take for example, 54.2 grams of reagent grade 99% pure BaO and 45.8 grams reagent grade $TiO_2$ in powdered form, would weigh them into a Pt-Rh crucible (1) whereby 62 mole % $TiO_2$ in excess of the stoichiometric composition of $BaTiO_3$ would be present in the charge as a flux. The crucible loaded with the non-stoichiometric $BaO/TiO_2$ powder charge would be placed in a furnace provided with heating element (18). The headspace of the crucible should be purged by flowing a $CO/CO_2$ RAP mixture into the crucible from gas generator (12). The $CO/CO_2$ RAP gas would be prepared by metering high purity (99.9%) $CO_2$ into a heated (800° C.) bed of high purity (99.9%) carbon particles in generator (12) at a flow rate of 2 cc/sec., whereby a gaseous mixture composed of ~20 mole % CO and ~80 mole % $CO_2$ would have been prepared and metered to the headspace (4).

After flushing of the headspace (4) with the $CO/CO_2$ RAP gas, the temperature of the top of the crucible (1) would be raised to 1440° C., the projected temperature at which isothermal growth of a single crystal $BaTiO_3$ would occur. The bottom of the crucible would be maintained at 1490° C. at which temperature the powder charge would be heated for 16 hours to insure that it was entirely liquid. The 0.3 cm. diameter hollow platinum rod bearing a $BaTiO_3$ seed crystal at its lower end would be lowered to the surface of the molten liquid (6) to top-seed and to initiate growth of the single crystal $BaTiO_3$ on the rod (2) from the molten liquid surface (7).

The seed would be rotated at 10 rpm. in a clockwise direction and would be withdrawn from the surface of the liquid melt (7) at a rate of 0.08 mm/hr. Pulling the seed crystal from the molten liquid surface (7) over a 125 hour period would result in the growth of a single crystal $BaTiO_3$ material of 1 cm. edge at a growth rate of 0.008 cm/hr. Simultaneous with the growth of the crystal, a residue of $BaTiO_3$ (8) formed on the bottom of the crucible (1) would be estimated to comprise about 20% of the original powder charge to the crucible (1).

EXAMPLE II

Figure 2:
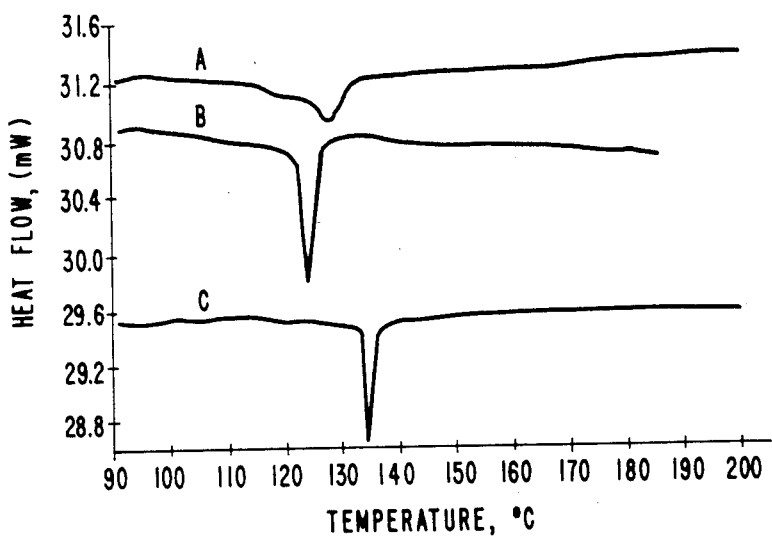
FIG. 2 consists of DSC thermograms depicting the ferroelectric transition behavior of commercial $BaTiO_3$ powder and flux-grown crystals.

FIG. 2 is a DSC thermogram depicting the ferroelectric-transition behavior of commercial $BaTiO_3$ powder (Curve A) produced by Ferro Corp., a sample of $BaTiO_3$ grown in air from a flux of potassium fluoride (Curve B); and a sample of $BaTiO_3$ crystals grown in air from a flux of titania (Curve C).

A DSC thermogram measures the behavior of the specific heat of a single crystal binary metal oxide versus the temperature when the metal oxide is heated through a region spanning the first-order ferroelectric transition phase, ie., a phase transition from tetragonal to cubic. The order of metal oxide purity correlates with the temperature which characterizes the onset of the phase transition and the temperature interval for its occurrence, ie., the purer the binary metal oxide crystal, the higher the onset temperature and the narrower the interval.

The $BaTiO_3$ powder illustrated by Curve A shows a lower onset temperature and a broad transition to, or depolarization of the ferroelectric state. Separate x-ray studies conducted on the $BaTiO_3$ powder illustrated by Curve A, shows it to be a pure tetragonal phase at room temperature, i.e., less than 96% purity, but greater than 90%.

Curve B illustrates a more pure material than that illustrated by Curve A, however the material is still appreciably contaminated by potassium and fluoride ion impurity (from the flux material). Note the broadened wing on the low-temperature side (at approximately 120° C.-130° C.). This condition is an indication of "pretransition" behavior. A normal transition would indicate the release of energy associated with that transition as a uniform spike in the temperature interval. The uniform spike indicates that the bulk crystal is depolarizing uniformly. Pre-transition behavior is nonuniform depolarization or structural change. This represents a fraction of the energy being released in the low temperature wing of the distribution. The pre-transition behavior is impacted by the presence of impurities.

With respect to Curve C, this type of wing broadening behavior is substantially lessened which indicates that the material illustrated by Curve C is a purer material.

This example illustrates how DSC thermograms can be utilized to evaluate the purity of crystals produced by the process of the present invention.

EXAMPLE III

Figure 3:
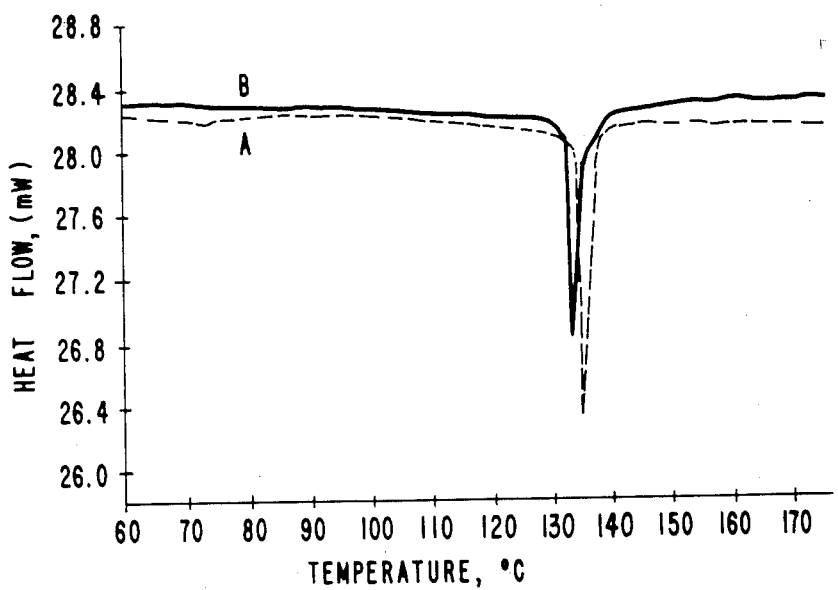
FIG. 3 consists of a DSC thermogram which depicts a flux-grown $BaTiO_3$ crystal (A) and a second thermogram which illustrates the degradation of the ferro-electric-transition behavior (B) after three heat cyclings in air.
Figure 4:
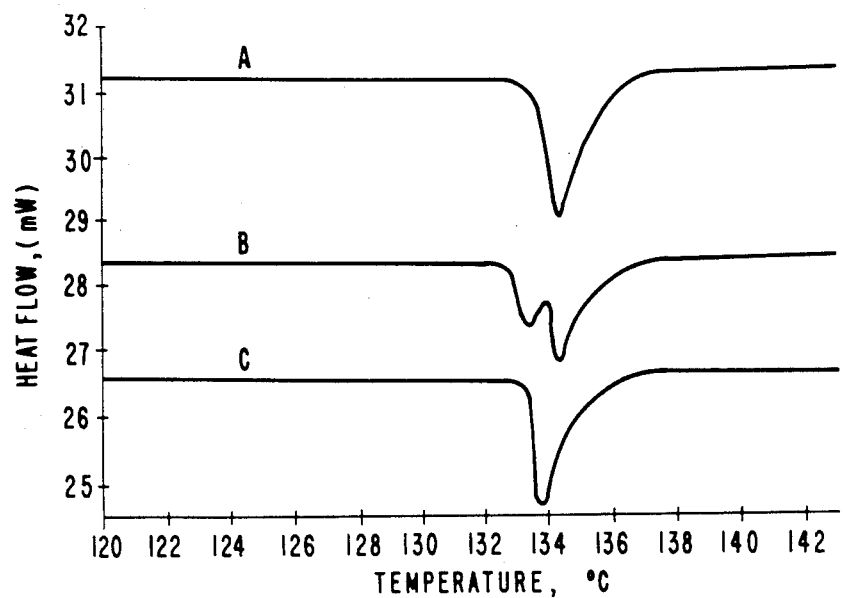
FIG. 4 depicts a comparison between three DSC thermograms of the $TiO_2$ flux-grown $BaTiO_3$ crystal (A) and the ferroelectric-transition behavior of the same specimen after heat treatment in $N_2:H_2$ gas (B) and in carbon monoxide (C).

FIGS. 3 and 4 will be used to illustrate how various conditions contribute to the degradation i.e., increases the impurity level of $BaTiO_3$ crystals.

FIG. 3 illustrates $BaTiO_3$ crystal grown in air and obtained from a $TiO_2$ flux. Curve A represents $BaTiO_3$ crystal as grown by $TiO_2$ flux and Curve B represents the same material illustrated by Curve A after 3 thermal cycles in air to 1460° C. The peak originally shown at approximately 135° C. is shorter, indicating a smaller heat flow. The degradation by the water vapor contained in the air is based on the following equation:

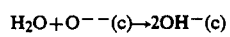

$$H_2O + O^{--}(c) \rightarrow 2OH^{-}(c)$$

which is analogous to Eq. (1). This degradation can occur at temperatures of approximately 700° C. which can be illustrated by reactions (2) and (3) to show the adverse role of the OH⁻ impurity. The color center formed acts as a reductant, as follows:

The shift in valence state from Ti$^{+4}$ to Ti$^{+3}$ imparts a blue color to the crystal, thereby making it more optically absorbing in the visible spectrum.

FIG. 4 illustrates that degradation of BaTiO$_3$ crystals as shown in FIG. 2 can also occur upon heating in forming gas N$_2$:H$_2$ (85:15 by volume) with the reaction described by Eq. (4). Curve A is BaTiO$_3$ crystal as grown in air from a TiO$_2$ flux. Curve B illustrates the degradation which follows by heating the BaTiO$_3$ crystals depicted by Curve A in forming gas, N$_2$:H$_2$=85:15 by volume. The crystals were heated at approximately 700° C. for four hours. Curve C of FIG. 4 illustrates the behavior of BaTiO$_3$ crystals (as illustrated by Curve A), after heating in a reactive atmosphere of carbon monoxide at approximately 700° C. for four hours. The wing on the low temperature side of Curve C rises abruptly, depicting a sharp transition. That rise is more gradual in the case of Curve A and even more degraded in looking at Curve B. The transition is an occurrence of two changes. First, the change in the state of polarization, i.e., ferroelectric to paraelectric (a second order process). Second, the change in crystal structure, i.e., tetragonal to cubic (a first order process). Crystal structure change is inherently a sharp transition. Any gradual change reflects the sluggishness of the change in the state of polarization. This in turn means heterogeneity in the interaction energy of the polarized regions. By the above description, it is clear that heating in carbon monoxide has decreased the OH⁻ content.

FIG. 3 and FIG. 4 illustrate how H$_2$O or H$_2$ can degrade a BaTiO$_3$ crystal while CO can upgrade i.e., purify, a BaTiO$_3$ crystal.

EXAMPLE IV

Figure 5:
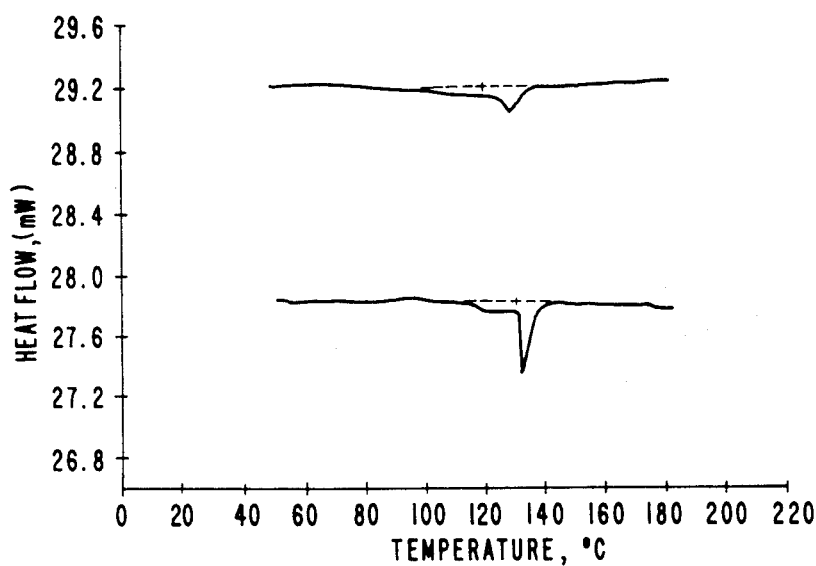
FIG. 5 depicts a comparison between two DSC thermograms one illustrating the ferroelectric-transition behavior of $BaTiO_3$ powder (A) before a rapid heatup to the soak temperature and the other (B), illustrates such behavior after exposure to a reactive atmosphere of carbon monoxide and carbon dioxide.
Figure 6:
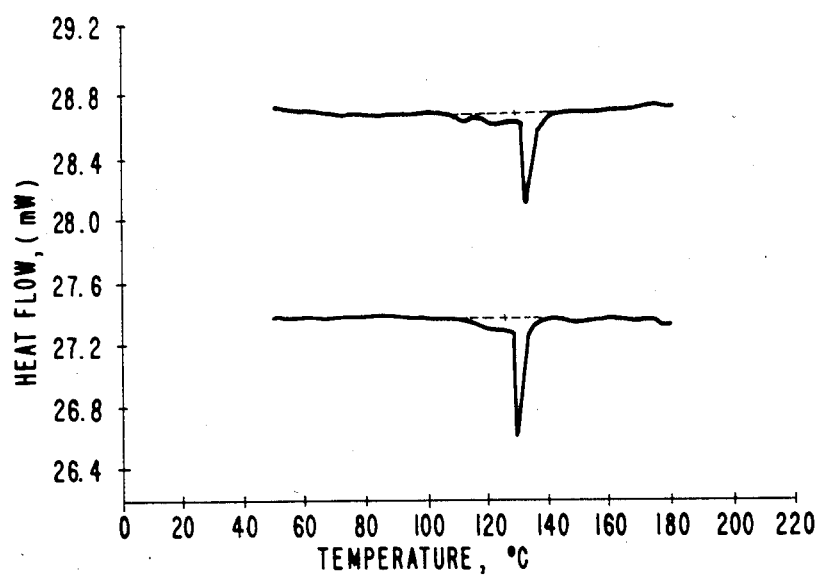
FIG. 6 depicts a DSC thermogram of $BaTiO_3$ prepared commercially (A) illustrating the ferroelectric-transition behavior after a gradual heatup to the soak temperature, and a second thermogram (B) depicting its behavior after exposure to a reactive atmosphere of carbon monoxide and carbon dioxide.
Figure 7:
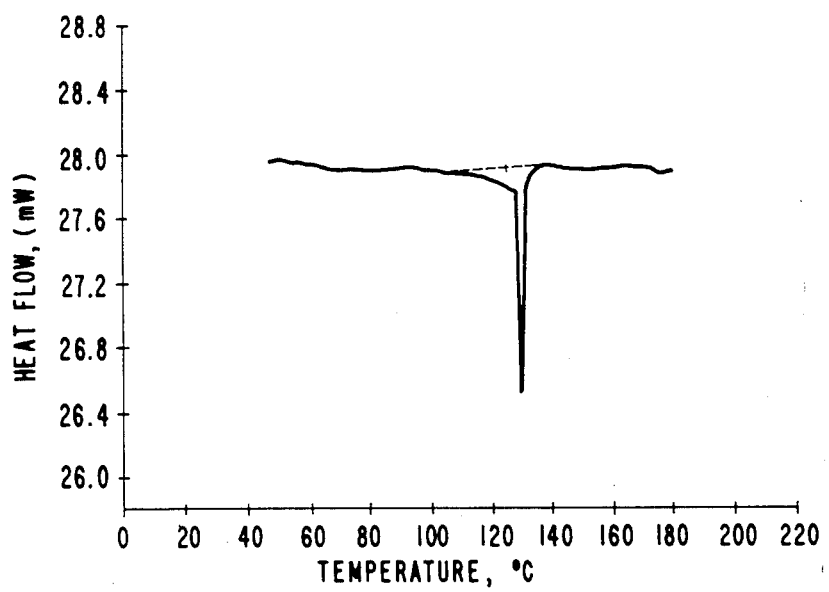
FIG. 7 depicts a DSC thermogram of $BaTiO_3$ powder illustrating the ferroelectric transition behavior after a gradual heatup to the soak temperature under a reactive atmosphere of carbon monoxide and carbon dioxide.

FIGS. 5, 6 and 7 illustrate DSC thermograms of BaTiO$_3$ crystals which have been exposed to a reactive atmosphere of carbon monoxide and carbon dioxide.

FIG. 5 illustrates BaTiO$_3$ powder (Curve A) provided by Ferro Corp. having a peak transition temperature of 128° C. and a change in heat content of approximately 0.152 kJ/mol. The BaTiO$_3$ powder was thereafter rapidly heated to approximately 1400° C. for 16 hours and then to approximately 1500° C. for 16.5 hours under a reactive atmosphere of CO:CO$_2$, as illustrated by Curve B. This rapid heatup to the soak temperature increased the peak temperature of the transition to 132° C. but lowered the heat-content change to 0.084 kJ/mol.

The peak temperature characterizes the size of the activation which must be supplied to trigger depolarization. The more stable the polarized state i.e., the purer the material, the higher the peak-temperature. The kJ/mol (heat content change) is the energy absorbed to depolarize the material. Hence the heat content change also measures the stability of the polarized state. The more stable the polarized state, the larger the kJ/mol absorbed for depolarization. The molar ratio of CO:-CO$_2$ that was utilized was 7:1.

By utilizing x-ray analysis techniques, it was discovered that more than half of the BaTiO$_3$ powder (illustrated by Curve B) had changed to the nonferroelectric hexagonal phase. The latter does not contribute to the heat content and accounts for the reduction in value from the 0.152 kJ/mol of Curve A to 0.084 kJ/mol of Curve B. Note in Curve B that approximately one-third of the total heat content is in the pre-transition region. This behavior and the partial conversion to the hexagonal phase can only be attributed to the impurities already present in the powder.

In FIG. 6, BaTiO$_3$ powder is heated gradually to approximately 1400° C. for 16 hours in a reactive atmosphere of CO:CO$_2$ to allow the removal of OH⁻(c) before the material loses its specific surface. The efficiency and thoroughness of the action of reactive atmosphere processing of the powder depends on how much surface per unit weight (i.e., specific surface) exists in the given time interval. The peak temperature remains at 132° C. (refer to Curve A). The heat-content change of 0.262 kJ/mol is higher than the original value of 0.152 kJ/mol illustrated in FIG. 5 (Curve A). X-ray analysis shows here, that no hexagonal phase is formed.

In Curve B (FIG. 6), another heat cycle at approximately 1450° C. for 15 hours is added, which raises the heat content change even further to 0.268 kJ/mol. The additional heating was performed upon exposure of the BaTiO$_3$ powder to a reactive temperature of CO:CO$_2$. Upon x-ray analysis, once again there appeared to be no transition to the hexagonal phase.

In FIG. 7, a third heat cycle was added while the BaTiO$_3$ powder was exposed to a reactive atmosphere of carbon monoxide and carbon dioxide. A heat cycle at approximately 1500° C. for 16.5 hours raised the heat-content change to 0.277 kJ/mol. The BaTiO$_3$ powder however, still exhibited no signs of transformation to the hexagonal phase. Utilizing this process based on a gradual heatup under CO and CO$_2$, cubic BaTiO$_3$ was stabilized up to and beyond 1500° C. This is well past the thermal stability limit of cubic BaTiO$_3$, which is reported by the literature to be 1460° C. In comparing the result of 0.277 kJ/mol (FIG. 7) with the value of 0.0843 kJ/mol of FIG. 5 (Curve B), it is clear that Curve B of FIG. 5 has about 70% of BaTiO$_3$ in the hexagonal phase, a result that agrees with the evaluation by x-ray.

What is claimed is:

1. A method for the growth of a single crystal binary metal oxide of the formula ABO$_3$ wherein A is an alkali or alkaline earth metal, B is at least one element selected from the group consisting of titanium, niobium and tantalum comprising the steps of:
   (a) preparing a mixture of a basic oxide or carbonate of A and an amount of an acidic oxide of B which is in excess of the stoichiometric amount required to form the ABO$_3$ crystal;
   (b) heating the mixture to an elevated temperature of from 700° C. to 900° C. to prepare a melt;
   (c) exposing the melt to a reactive atmosphere of a mixture of carbon monoxide and carbon dioxide for a period time sufficient to effect single crystal growth of substantially pure, ABO$_3$ crystal; and
   (d) growing a single crystal of substantially pure ABO$_3$.

2. The method in accordance with claim 1 wherein the melt includes an excess of the acidic B-oxide constituent ranging from about 10 to about 20 mole percent.

3. The method in accordance with claim 1 wherein basic oxide or carbonate of the A constituent is BaO.

4. The method in accordance with claim 1 wherein the acidic B oxide constituent is TiO$_2$.

5. The method in accordance with claim 1 wherein the melt is heated at its isothermal melt temperature.

6. The method in accordance with claim 1 wherein $ABO_3$ is $BaTiO_3$ and the melt is isothermally heated at 700° C.

7. The method of claim 1 wherein crystal growth is initiated by top-seeding the melt.

8. The method of claim 1 wherein the molar ratio of $CO/CO_2$ gaseous atmosphere is of about 7:1 to about 1:9.

* * * * *

UNITED STATES PATENT AND TRADEMARK OFFICE
CERTIFICATE OF CORRECTION

PATENT NO. : 4,724,038
DATED : February 9, 1988
INVENTOR(S) : RICARDO C. PASTOR ET AL It is certified that error appears in the above—identified patent and that said Letters Patent is hereby corrected as shown below:

Column 2, line 61, "[↑]" instead of "[↑]".

Column 2, line 61, "[↑↓]" instead of "[↑↓]".

Column 3, line 3, "[↑]" instead of "[↑]".

Column 3, line 12, "[↑]" instead of "[↑]".
Column 11, line 5, "[↑]" instead of "[↑]".

Signed and Sealed this

Thirty-first Day of January, 1989

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,724,038
DATED : February 9, 1988
INVENTOR(S) : Richardo C. Pastor et al It is certified that error appears in the above-identified patent and that said Letters Patent is hereby corrected as shown below:

Column 5, line 40, "$Nb_2O_3$" should read -- $Nb_2O_5$ --.

Signed and Sealed this

Ninth Day of May, 1989

Attest:

DONALD J. QUIGG

Attesting Officer

Commissioner of Patents and Trademarks